United States Patent
Sosedov

(10) Patent No.: US 8,083,400 B2
(45) Date of Patent: Dec. 27, 2011

(54) ARRANGEMENT WITH AN ASSEMBLY AND A MOUNTING RACK

(75) Inventor: Sergej Sosedov, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 647 days.

(21) Appl. No.: 12/286,678

(22) Filed: Oct. 1, 2008

(65) Prior Publication Data

US 2009/0086790 A1    Apr. 2, 2009

(30) Foreign Application Priority Data

Oct. 1, 2007   (EP) .................................. 07019293

(51) Int. Cl.
*G01N 25/18*   (2006.01)
*G01K 17/08*   (2006.01)
*H05K 7/20*    (2006.01)

(52) U.S. Cl. .......................................... 374/44; 361/748

(58) Field of Classification Search .................. 374/44; 361/748
See application file for complete search history.

(56) References Cited

U.S. PATENT DOCUMENTS

| | | | |
|---|---|---|---|
| 3,883,715 A | 5/1975 | Gebo | |
| 4,696,578 A * | 9/1987 | Mansuria et al. | 374/45 |
| 4,859,078 A * | 8/1989 | Bowman et al. | 374/44 |
| 5,042,294 A * | 8/1991 | Uzzell | 73/75 |
| 5,837,970 A * | 11/1998 | Jilek | 219/201 |
| 5,980,312 A * | 11/1999 | Chapman et al. | 439/540.1 |
| 6,897,418 B1 * | 5/2005 | Gunther | 219/543 |
| 7,185,500 B2 * | 3/2007 | Meir | 62/3.2 |
| 7,307,224 B2 * | 12/2007 | Sakai | 174/520 |
| 7,578,614 B2 * | 8/2009 | Chen et al. | 374/44 |
| 7,662,546 B2 * | 2/2010 | Kawano et al. | 430/330 |
| 2003/0057199 A1 * | 3/2003 | Villa et al. | 219/521 |
| 2005/0146850 A1 | 7/2005 | Meir | |
| 2005/0247701 A1 * | 11/2005 | Deka et al. | 219/548 |
| 2006/0102614 A1 * | 5/2006 | Kawano et al. | 219/444.1 |
| 2007/0097656 A1 | 5/2007 | Sakai | |

OTHER PUBLICATIONS

Siemens Catalog ST 70; Edition 2007; pp. 5/2 and 5/112.

* cited by examiner

*Primary Examiner* — Christopher Fulton

(57) ABSTRACT

The invention relates to an arrangement with a mounting rack and at least one assembly provided with a housing encapsulation and mounted on the mounting rack, wherein the mounting rack and the assembly have contacting means which are thermally connected to each other. Suitable measures are provided with which the quality of the heat dissipation is identified at the correct time.

8 Claims, 2 Drawing Sheets

ARRANGEMENT WITH AN ASSEMBLY AND A MOUNTING RACK

CROSS REFERENCE TO RELATED APPLICATIONS

This application claims priority of European application No. 07019293.5 filed Oct. 1, 2007, which is incorporated by reference herein in its entirety.

FIELD OF THE INVENTION

The invention relates to an arrangement with a mounting rack and at least one assembly provided with a housing encapsulation and mounted on the mounting rack, wherein the mounting rack and the assembly have contacting means which are thermally connected to each other. In addition, the invention relates to an assembly which is suitable for use in a mounting rack of this kind.

BACKGROUND OF THE INVENTION

Higher performance electronic components are increasingly used in assemblies for automation technology thus necessitating measures for dissipating the heat from the assemblies. For this, it is usual to employ heat sinks in these assemblies, in particular because fans for heat dissipation are not desired in automation technology.

Known from the Siemens Catalog ST 70, Edition 2007, pages 5/2 and 5/112 is an automation device comprising a plurality of assemblies and a mounting rack. The mounting rack is provided to accommodate the assemblies and to supply them with an operating voltage, wherein the assemblies may be plugged into slots in a rear panel bus by means of which the assemblies are connected to each other. Each slot in the mounting rack has on one edge three spring contacts arranged in parallel and provided with a ground potential which are electrically connected to a connector of a plugged-in assembly. Due to the ageing of the spring contacts and the associated deterioration in the elasticity of the spring contacts or due to contamination of the spring contacts, there is an increase in the contact or transfer resistance between the spring contacts and the corresponding connector of the respective plugged-in assembly. This results in an increase in the electrical power loss at the contact point and in addition the thermal power loss from the assembly is only poorly dissipated by the rear panel bus resulting in an increase in the temperature in the assembly. If a critical temperature is reached in the assembly, its operation can be disrupted and this has a detrimental impact on the technical process to be controlled.

SUMMARY OF THE INVENTION

The present invention is based on the object of providing an arrangement of the type mentioned in the introduction with which the quality of the heat dissipation is identified at the correct time. The object is also to specify an assembly which is suitable for an arrangement of this kind.

This object is achieved in respect of the arrangement and in respect of the assembly with the measures disclosed in the claims.

The invention is based on the concept of determining before start-up or before the actual operation of the arrangement whether good thermal conductivity is ensured between the contacting means of the assembly and the contacting means of the mounting rack as an "external" heat sink. In cases when, contrary to a desired heat conduction within the framework of a defined heat input, the temperature in the housing encapsulation of the assembly increases too rapidly, attention is drawn to the fact that the contacting means cannot dissipate the heat sufficiently and the thermal contacting is poor. In such a case, corresponding measures can be taken before the actual operation, for example such as exchanging the assembly and replacing it with another one.

In one embodiment of the invention, it is provided that the contacting means of the assembly and of the mounting rack have a planar design which means that the thermal contacting is simple to produce.

In a further embodiment the invention, the contacting means have a surface-enlarging, for example saw-tooth-shaped, design. This measure achieves a very good thermal connection.

BRIEF DESCRIPTION OF THE DRAWINGS

The following describes the invention, its embodiments and advantages in more detail with reference to the drawing, which depicts an exemplary embodiment of the invention.

DETAILED DESCRIPTION OF THE INVENTION

Figure 2:
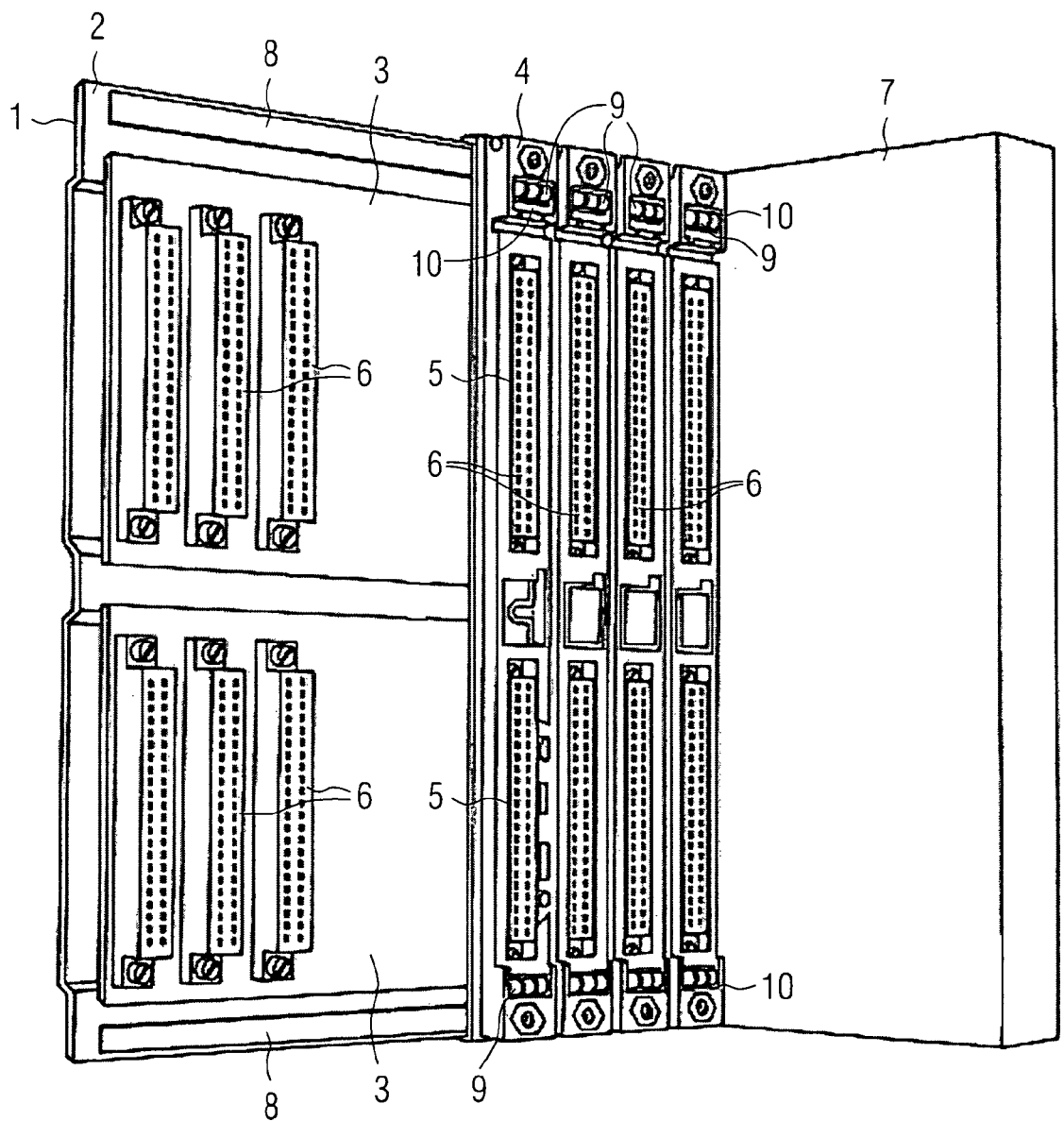
FIG. 2 components of an automation device.

Reference is made first to FIG. 2 which depicts components of an automation device which is known per se. A mounting rack 1 comprises an aluminum rack 2, two bus boards 3 mounted on this rack 2 and a plastic rack 4 through the openings 5 of which connectors 6 of the bus boards 3 project toward the terminal side of the mounting rack 1. In the exemplary embodiment depicted, only one assembly 7 of the automation device provided with a housing encapsulation is shown which is mounted on one of the connectors 6. The aluminum rack 2 is provided with two grounding bars 8 on which the electrically conductive spring contact parts 9 are mounted and which are guided through further openings 10 of the plastic rack 4. These contact parts 9 come into contact with contacting means of the plugged-in assembly 7 causing this assembly 7 to be connected to the ground potential, wherein in addition the thermal power loss of the assembly 7 is dissipated via these contacting means to the grounding bar 8. Further components of the assembly 7, such as for example a printed circuit board provided with a plurality of electronic components, are of no significance for the invention and will therefore not be explained in any more detail.

Figure 1:
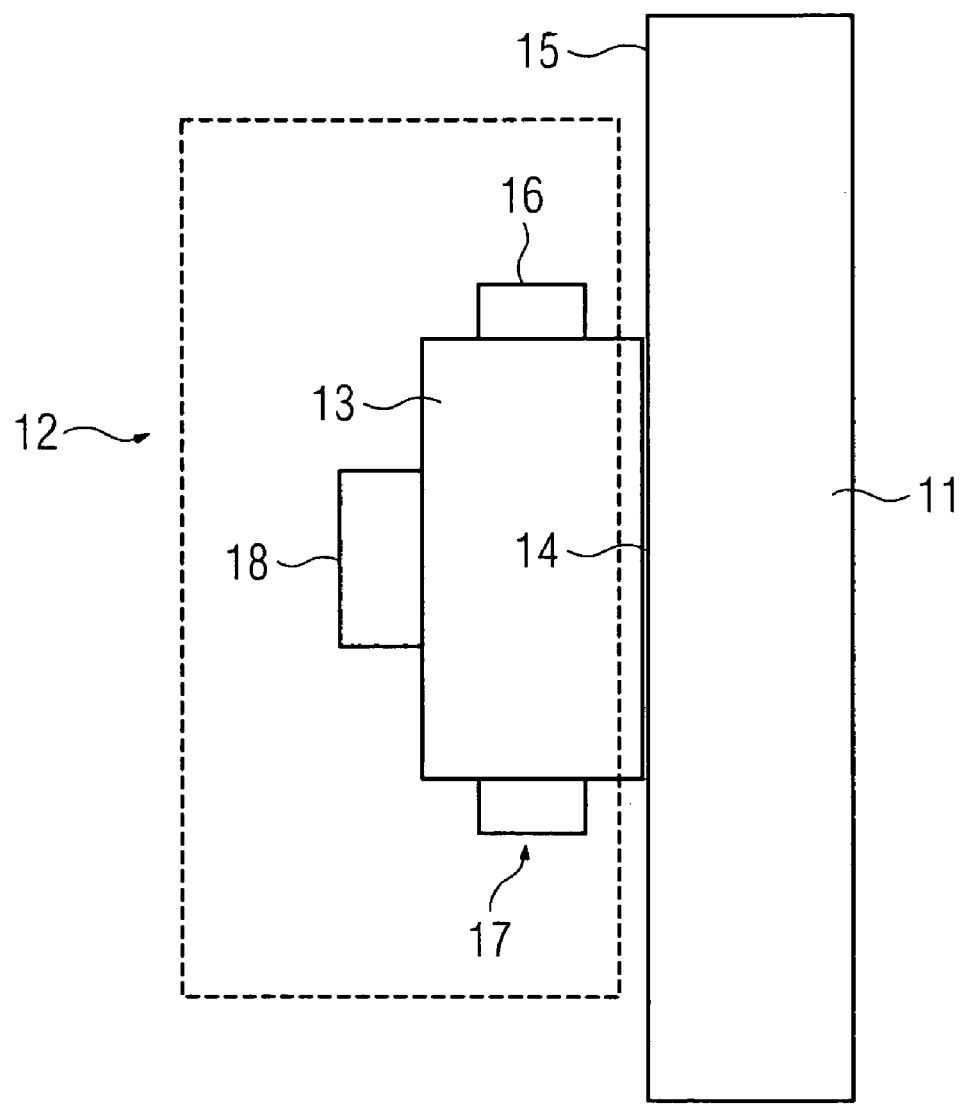
FIG. 1 shows components of an assembly and a mounting rack.

To check the quality of the heat dissipation between the contacting means of the plugged-in assembly 7 on the mounting rack 1 and the grounding bar 8, it is provided that a heating element, a temperature sensor and an evaluation unit are arranged in the housing encapsulation of the assembly 7. Hereby, the heating element increases the temperature in the housing encapsulation cyclically or in accordance with pre-definable times, the temperature sensor detects the temperature increase and the evaluation unit checks the heat conduction between the contacting means on the basis of the thermal energy supplied by the heating element and the temperature increase or the rate of temperature rise. In this context, reference is made to FIG. 1 which depicts components of an assembly and a mounting rack.

An external heat sink in the form of a grounding bar 11 of a mounting rack is provided to dissipate the heat formed in a housing encapsulation of an assembly 12. Obviously, it is possible for the mounting rack itself to serve as a grounding bar or for the mounting rack itself to be designed to dissipate the heat of the assembly 12. The assembly 12 is provided with a contacting means 13, wherein a side surface 14 of this contacting means 13 is thermally connected to a part of a surface 15 of the grounding bar 11. It can now occur that the side surface 14 of the contacting means 13 of the assembly 12 swiveled onto the mounting rack is not in sufficient thermal contact with the side surface 15 of the grounding bar 11, for example because the contact surfaces are dirty or because a swivel mechanism (not shown here) of the assembly 12 is defective. In order to identify a poor thermal connection between the contacting means 11, 13 of this kind at the correct time, before the operational control of the automation device, for example, a heating element 16 supplies a defined amount of thermal energy to the contacting means 13, wherein a temperature sensor 17 detects a temperature increase effected thereby in the housing encapsulation or of the contacting means 13. An evaluation unit 18 connected to the temperature sensor 17 and the heating element 16 knows for example from a default setting, the degree to which with a good or sufficient contacting of the assembly 7 to the grounding bar 11 the temperature in the housing encapsulation can increase due to the thermal energy supplied or how rapid the temperature rise can be in order to ensure trouble-free operation within the framework of a process control. In the event that, contrary to the correct heat conduction within the framework of a defined supply of thermal energy, the temperature in the housing encapsulation of the assembly rises too rapidly or the temperature exceeds a threshold value, it brings attention to the fact that the contacting means 13 are not dissipating the heat sufficiently via the grounding bar 11 and the thermal contacting is poor. In this case, for example, the contacting means 13 should be checked; it may be necessary to exchange the assembly and replace it with a new assembly.

It is obviously possible, also to check the quality of the heat dissipation during the control of a technical process. In this case, the "normal" thermal power loss of the assembly should be taken into account during the operational control, wherein corresponding default settings have to be stored in the evaluation unit 18.

The invention claimed is:

1. An arrangement for identifying a quality of a heat dissipation, comprising:
    a mounting rack;
    a contacting device arranged on the mounting rack;
    an assembly provided with a housing encapsulation and mounted on the mounting rack;
    a further contacting device arranged on the assembly and thermally connected to the contacting device of the mounting rack;
    a heating element arranged on the assembly that increases a temperature in the housing encapsulation;
    a temperature sensor arranged on the assembly that detects the temperature increase; and
    an evaluation unit arranged on the assembly that checks a heat conduction between the contacting device and the further contacting device based on a thermal energy supplied by the heating element and the temperature increase.

2. The arrangement as claimed in claim 1, wherein the contacting device and the further contacting device have planar surfaces.

3. The arrangement as claimed in claim 1, wherein the contacting device and the further contacting device have surface-enlarging surfaces.

4. The arrangement as claimed in claim 1, wherein the evaluation unit checks the heat conduction between the contacting device and the further contacting device periodically or in a predefined time.

5. An assembly provided with a housing encapsulation and mounted on a mounting rack, comprising:
    a contacting device that is thermally connected to a further contacting device of the mounting rack;
    a heating element that increases a temperature in the housing encapsulation;
    a temperature sensor that detects the temperature increase; and
    an evaluation unit that checks a heat conduction between the contacting device and the further contacting device based on a thermal energy supplied by the heating element and the temperature increase.

6. The assembly as claimed in claim 5, wherein the contacting device and the further contacting device have planar surfaces.

7. The assembly as claimed in claim 5, wherein the contacting device and the further contacting device have surface-enlarging surfaces.

8. The assembly as claimed in claim 5, wherein the evaluation unit checks the heat conduction between the contacting device and the further contacting device periodically or in a predefined time.

* * * * *